United States Patent
Piazza et al.

(10) Patent No.: US 8,810,307 B2
(45) Date of Patent: Aug. 19, 2014

(54) APPARATUS AND METHOD FOR TUNING A GM-C FILTER

(75) Inventors: Francesco Piazza, Bioggio (CH); Claudio Cantoro, Cornaredo (IT)

(73) Assignee: QUALCOMM Incorporated, San Diego, CA (US)

( * ) Notice: Subject to any disclaimer, the term of this patent is extended or adjusted under 35 U.S.C. 154(b) by 538 days.

(21) Appl. No.: 12/936,494

(22) PCT Filed: Jun. 11, 2009

(86) PCT No.: PCT/EP2009/057236
§ 371 (c)(1),
(2), (4) Date: Oct. 5, 2010

(87) PCT Pub. No.: WO2009/153211
PCT Pub. Date: Dec. 23, 2009

(65) Prior Publication Data
US 2011/0025411 A1 Feb. 3, 2011

(30) Foreign Application Priority Data

Jun. 19, 2008 (EP) .................................. 08158625

(51) Int. Cl.
*H03B 1/00* (2006.01)
*H03H 11/12* (2006.01)
(52) U.S. Cl.
CPC ................................ *H03H 11/1291* (2013.01)
USPC ......................................................... 327/553
(58) Field of Classification Search
USPC ................................................. 327/551–559
See application file for complete search history.

(56) References Cited

U.S. PATENT DOCUMENTS

| 6,512,414 | B2 * | 1/2003 | Yokoyama et al. ............ 327/553 |
| 6,952,130 | B2 * | 10/2005 | Kuyel et al. .......................... 330/9 |
| 7,002,404 | B2 | 2/2006 | Gaggl et al. |
| 7,050,762 | B2 | 5/2006 | Boldt et al. |
| 2002/0008572 | A1 | 1/2002 | Hayashi et al. |
| 2002/0196076 | A1 | 12/2002 | Saiki |
| 2008/0125141 | A1 * | 5/2008 | Lai ............................. 455/456.1 |

FOREIGN PATENT DOCUMENTS

| CN | 1289479 A | 3/2001 |
| JP | 2001274654 A | 10/2001 |
| JP | 2002043894 A | 2/2002 |
| JP | 2002094357 A | 3/2002 |
| JP | 2002344288 A | 11/2002 |
| JP | 2004274120 A | 9/2004 |
| WO | WO2006128075 | 11/2006 |

OTHER PUBLICATIONS

International Search Report & Written Opinion—PCT/EP2009/057236, International Search Authority—European Patent Office—Jan. 13, 2010.

* cited by examiner

*Primary Examiner* — Sibin Chen
(74) *Attorney, Agent, or Firm* — Howard Seo

(57) ABSTRACT

An apparatus to control a tuneable Gm-C filter, including and a filter that can be reconfigured as a free running oscillator by toggling the feedback sign of an output amplifier (304), a digital controller (42), sensitive to the output of the filter in the calibration configuration, and a DAC (44) to provide an analogue control signal (48) to the gm inputs of the transconductance amplifiers (310, 320) composing the filter.

17 Claims, 2 Drawing Sheets

Related Art
Fig. 1
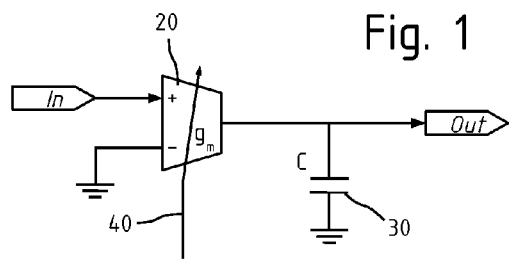
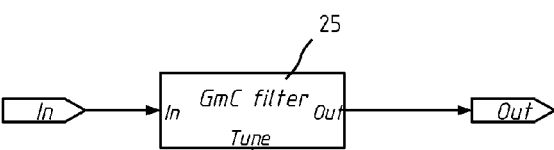
Fig. 2
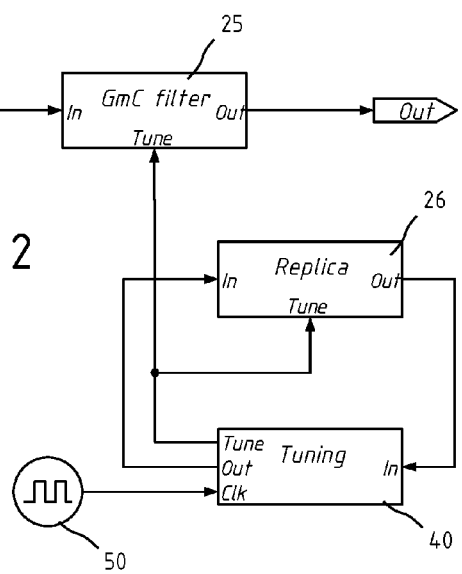
Related Art
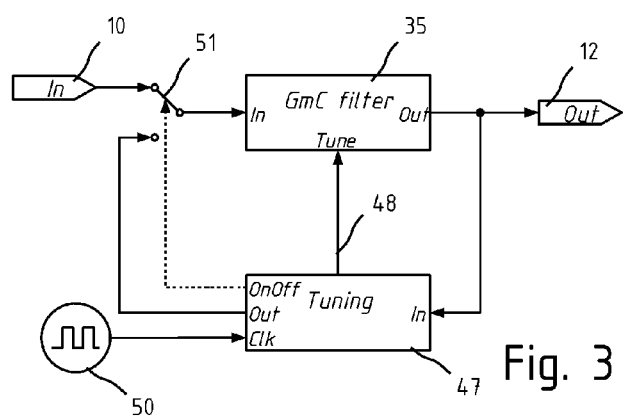
Fig. 3

APPARATUS AND METHOD FOR TUNING A GM-C FILTER

REFERENCE DATA

The present application claims priority from European Patent Application EP08158625 filed on 19 Jun. 2008.

FIELD OF THE INVENTION

The present invention concerns a Gm-C filter and, more particularly, to a system comprising an apparatus and a method for automatically tuning a gm-C in order to compensate for temperature drifts and manufacturing tolerances.

DESCRIPTION OF RELATED ART

Gm-C filters (also known as OTA-C filters) are a popular class of analogue electronic active filters that are used in many application areas, including wireless communication applications. These filters are particularly attractive in that they can provide fully integrated filters, combining low power consumption and good speed. Gm-C filter are increasingly used, among others, in modern radio receivers. In GPS or GNSS receivers, in particular, one or more gm-C filter are often used in an IF stage of the RF front-end.

The key component of Gm-C filters is a transconductance amplifier. An ideal operational transconductance amplifier (OTA) is a voltage controlled current source, having constant transconductance $g_m$, that is, providing a current proportional to the voltage difference between its input terminals, which are assumed to have infinite input impedance. A Gm-C filter comprises one or more transconductance amplifiers, used as open-loop amplifiers, connected to capacitors C.

FIG. 1 shows a simple first-order Gm-C filter, consisting of a transconductance stage 20, connected to a capacitor 30. The amplifier 331 is connected in a local feedback loop to synthesize a resistance $R=1/g_2$. This configuration is a low-pass filter with a transfer function $$\frac{v_{out}}{v_{in}} = \frac{g_1/g_2}{1+C \cdot s/g_2}$$

An important advantage of Gm-C filters is the ability to set the transconductance value $g_m$, for example by changing a bias current of a transistor stage. The transconductance amplifier 20 disposes of a gain-setting terminal 40, by which the cut-off frequency can be tuned.

Filters based on the Gm-C technique are very dependent on the absolute values of the characteristics of both the transistors and the capacitors used in their structure. Most industrial IC production processes, however, do not allow a strict control of absolute transistor gain or capacitance; Gm-C filters often exhibit rather large tolerances and temperature dependences.

It is known in the art to tune a Gm-C filter by providing a matched replica Gm-C filter in the same circuit, preferably in the same semiconductor die, as it is shown in FIG. 2. The output and the input of the replica filter 26 are connected together by the tuning circuit, thus introducing a positive feedback that puts the replica filter in oscillation. The tuning circuit 40 acts as a PLL, adjusting the bias level of both the replica filter and the main filter in order to lock the oscillation of the replica filter 26 with the reference clock 50. Assuming that the $g_m$ values of the main filter perfectly match those of the replica filter, the cut-off frequency $\omega_c$ will be locked to the frequency of the reference clock.

This solution inevitably leads to an increase in area and power consumption. While this may be acceptable in a complex circuit, where the replica filter represents only a small fraction of the total area and power budget, it is a severe penalty in simpler circuits, or in cases in which the energy available is very limited; for example in battery-powered portable equipment like, for example, a portable GPS or GNSS receiver.

The use of a replica filter also introduces a matching issue. Since only the parameters of the replica are monitored, tuning accuracy is limited by the mismatch between the replica and the main filter circuit.

BRIEF SUMMARY OF THE INVENTION

There is therefore a need to provide an apparatus for tuning a Gm-C filter that is free from the shortcoming of the known solutions.

It is an aim of the present invention to provide such a filter and, in particular, it is an aim of the present invention to provide smaller filters, free from matching problems, which that take up less silicon space and consume less power.

According to the invention, these aims are achieved by means of a system and a method according to the independent claims in the corresponding categories, the dependent claims relating to preferred optional aspects of the invention. In particular these aims are achieved by an apparatus for tuning a Gm-C filter, comprising: a Gm-C filter including one or several interconnected Gm-C cells, the Gm-C cells having a transconductance amplifier, a tuning terminal, and a transconductance gain that is dependent from an electric value present on the tuning terminal; the Gm-C filter including one or more switching elements, allowing to configure the Gm-C filter in a calibration configuration and in a filtering configuration; a digital controller, operatively arranged to measure the response of the Gm-C filter in the calibration configuration, and to generate a digital tuning value depending on the response; a digital-to-analogue converter, converting said digital tuning value into an analogue tuning signal, fed to the tuning terminals of the Gm-C cells; whereby the apparatus is operatively arranged to converge, in the calibration configuration, to a predefined response, and the digital-to-analogue converter is operatively arranged to maintain the resulting tuning signal in the filtering configuration.

BRIEF DESCRIPTION OF THE DRAWINGS

The invention will be better understood with the aid of the description of an embodiment given by way of example and illustrated by the figures, in which:

FIG. 1 shows schematically a Gm-C integrator of known type.

FIG. 2 shows schematically a known structure of tunable Gm-C filter.

FIG. 3 represents schematically the global architecture of a Gm-C filter according to one aspect of the present invention.

DETAILED DESCRIPTION OF POSSIBLE EMBODIMENTS OF THE INVENTION

Figure 4:
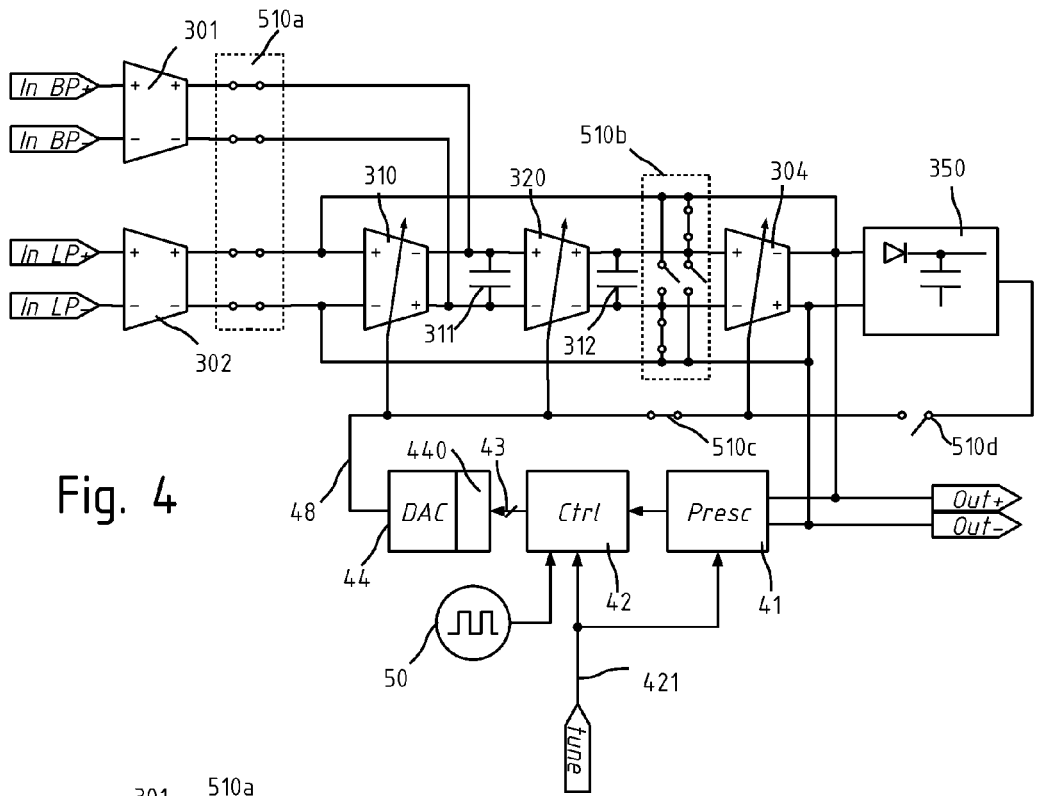
FIGS. 4 and 5 show with more detail an embodiment of the present invention; the circuit being configurable in a filtering configuration and in a tuning configuration.

FIG. 3 represents schematically a Gm-C filter according to a first aspect of the present invention. The system comprises a tunable Gm-C filter 35, a tuning controller 47 and a switch 51. It must be understood that FIG. 3 is a simplified representation of the filter of the invention, aimed at explaining its general structure in term of high-level functional blocks, and not a detailed schematics.

The switch 51 allows two operation states. In the first state (the filtering state), which is represented in the figure, the input of the filter 35 is connected with the input terminal 10 and the tuning signal 48 generated by the tuning controller 47 is stationary. The circuit 35 operates as a filter, with a frequency response determined by the value of the tuning signal 48.

When an adjustment of the tuning is needed, the switch 51 changes state. In the tuning state, the input of the filter 47 is connected with the output of the tuning controller 47 that, in turn, has a signal derived from the output signal 12 of the filter 35, so that a positive feedback is introduced, which puts the filter in self-sustained oscillations. The filter 35 operates in this state as a VCO, with the tuning terminal acting as control.

The frequency of the oscillations in the calibration state is related to the frequency response of the filter in filtering state. The digital tuning controller includes a digital circuit that measures the period of the oscillation, referred to the clock signal 50, and generates a digital tuning value, according to a pre-programmed calibration scheme, to bring the oscillation period towards the desired value. This digital tuning value is converted by a DAC into a tuning signal 48, which is fed to the tuning input of the filter 35. In this way the oscillation period converges, after a short transient, to the desired value. When the calibration cycle is complete, the system returns into the filtering state. The digital tuning value is held in a register during normal filtering, so that the tuning value can be maintained indefinitely.

The present invention thus provides, in systems that can be interrupted and do not require continuous operation of the filter, the possibility to dispose completely of the replica filter. The tuning controller is active only during the calibration cycle, which typically last only a few milliseconds, and can be switched off in normal operation, thus it contributes negligibly to the power consumption. The frequency of the calibration cycle is chosen according to the desired stability and expected temperature gradients, and is typically of one calibration every few seconds.

According to a variant of the invention, the tuning controller 47 injects, in calibration mode, a signal at the input of the filter 35, and measures the propagation delay of the filter 35. The tuning signal 48 is then corrected to obtain a target delay value, corresponding to the desired frequency response.

Figure 5:
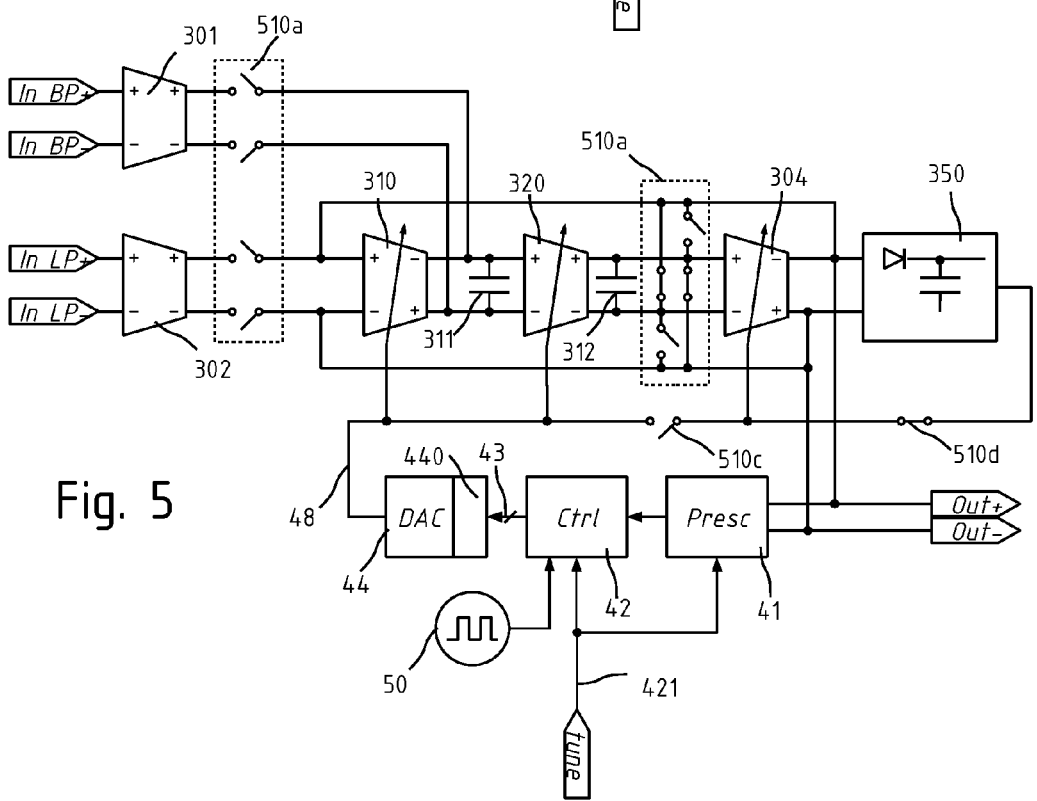

FIGS. 4 and 5 illustrate the filtering state and the calibration state of a system according to an embodiment of the invention. FIG. 4 shows a biquad Gm-C filter with two transconductance amplifiers 310 and 320, loaded by capacitors 311 and 312 to provide two integrator stages. The output of the third transconductance amplifier 304 is negatively fed back to its input, in order to synthesize a load resistance $R_L=1/g_m$ that sets the Q factor of the filter. The filter can be used both in low-pass mode, injecting the input signal at the input of the first transconductance amplifier 310, and in band-pass mode, injecting the input signal between the first transconductance amplifier 310 and the second transconductance amplifier 320. Amplifiers 301 and 312 are input buffers for the band-pass input and, respectively, for the low-pass input.

The circuit of FIG. 4 is a relatively simple filter that can be usefully employed, for example, as IF-filter in an intermediate frequency stage of a RF receiver, for example in a GNSS receiver. The present invention, however, is not limited to a particular filter configuration, and is applicable to any Gm-C tuneable filter.

FIG. 5 depicts the same circuit in the calibration configuration. The calibration state is entered upon reception of a command signal on the "tune" input 421 of the digital controller 42 which in turn, toggles the switches 510*a*, 510*b*, 510*c*, and 510*d*. In this configuration the feedback on output transconductance amplifier 304 becomes positive, so that this cell synthesizes a negative resistance, and the overall filter circuit is reconfigured as an oscillator. The resonance frequency of the oscillator is determined by the $g_m$ and C values of the preceding elements 310, 320, 311, and 312. This means that the resonance frequency of the circuit running as a filter is the same, the tuning of the transconductance amplifiers 310 and 320 being equal, as the resonance frequency of the circuit reconfigured as a free running oscillator. The fact that the components making up the filter and the oscillator are exactly the same, and not a replica, disposes of all matching problems. Also the stray capacitances at the nodes do not change when the configuration is switched, so their effect on the oscillation frequency of the oscillator or on the centre frequency of the filter is the same.

It is important that amplitude of the oscillation should not drive the filter in saturation or in a non-linear operating zone. In the calibration configuration the circuit includes an amplitude regulation loop. The $g_m$ input of transconductance amplifier 304 is not connected to the others, but is separately driven, through switch 510*d*, by an amplitude regulation circuit 350 that reduces the gain of the last stage when the amplitude increases. Since the oscillation frequency is determined by the previous stages 310, 320, the gain of the output stage can be independently modified without affecting the calibration. The circuit stabilizes at an operating point in its linear range, without exceeding the dynamic limits. The oscillation waveform is a sinusoid.

The amplitude regulation circuit could include a diode and a capacitor, connected in a peak detector configuration, as shown in the picture, or any other equivalent circuit.

The oscillating signal is divided by a prescaler 41, in order to bring its frequency to a convenient value, and than processed by the digital controller 42. The digital controller measures the period or the frequency of the divided oscillating signals, with reference to a reference clock signal 50, and generates a digital tuning value 43 based on the measured period or frequency. The DAC 44 is used to provide an analogue tuning signal 48 that is applied to the $g_m$ control inputs of the transconductance amplifiers 310, 320, closing the control loop.

In a particular embodiment of the invention the filter of the invention is used as intermediate frequency filter in a GPS RF front-end. The IF signal has a carrier frequency of 90-100 MHz, and this is also the frequency of the oscillations of the circuit in the calibration configuration of FIG. 5. The prescaler 41 divides the frequency by a scaling factor 128 or 256, for example, and the controller 42 measures the period on a time base provided by a clock signal at 10 MHz. Other applications are however possible.

The $g_m$ of transconductance amplifiers 310, 320 is typically controlled by the transistor bias current of the $g_m$ cell. The DAC 44 is preferably implemented using weighted current sources. By using PTAT (Proportional To Absolute Temperature) sources, the circuit can be almost entirely compensated in temperature, so that the filter calibration has to deal mainly with process spread. In that way the dynamics of the correction value 43 is reduced, with a consequent reduction in the number of bias sources, logic and bus width, and the time between successive calibrations may be longer.

The use of a digital controller allows storing the control value indefinitely. An analogue implementation would be possible, but would need more frequent tuning operations to refresh this value. Preferably the correction value is stored in a register 440 between two successive calibrations, so that the DAC 44 can produce a constant tuning signal. In the filtering configuration, the prescaler 41 is preferably stopped, and the controller 42 is switched off or put in a low-power mode. In this way the control circuit contributes negligibly to power consumption and switching noise.

The invention claimed is:

1. Apparatus for tuning a Gm-C filter, comprising:
   a Gm-C filter including one or several interconnected Gm-C cells, the Gm-C cells having a transconductance amplifier, a tuning terminal, and a transconductance gain (gm) that is dependent from an electric value present on the tuning terminal;
   the Gm-C filter including one or more switching elements, allowing to configure the Gm-C filter in a calibration configuration and in a filtering configuration;
   a digital controller, operatively arranged to measure a response of the Gm-C filter in the calibration configuration, and to generate a digital tuning value depending on the response measured;
   a digital-to-analogue converter, converting said digital tuning value into an analogue tuning signal, fed to the tuning terminals of the Gm-C cells; and
   an amplitude regulation unit operatively arranged to limit the forward gain when the Gm-C filter is in the calibration configuration;
   wherein the apparatus is operatively arranged to converge, in the calibration configuration, to a predefined response, and the digital-to-analogue converter is operatively arranged to maintain the resulting tuning signal in the filtering configuration.

2. The apparatus of claim 1, wherein the calibration configuration of the Gm-C filter is a free running oscillator, and wherein the digital controller is operatively arranged to measure a period or a frequency of the oscillations of the Gm-C filter in the calibration configuration, and to generate a digital tuning value depending from the measured period or frequency.

3. The apparatus of claim 2, wherein the Gm-C filter includes an output amplifier in a local feedback loop, whereby the local feedback has opposite signs in the filtering configuration and in the calibration configuration.

4. The apparatus of claim 3, whereby the output amplifier is configured as a positive load resistance in the filtering configuration, and a negative resistance in the calibration configuration.

5. The apparatus of claim 3, wherein the amplitude regulation unit is arranged to modify the transconductance of an output amplifier of the Gm-C filter, in an amplitude control loop.

6. The apparatus of claim 2, further comprising a prescaler operatively arranged to divide the frequency of the oscillations of the Gm-C filter in the calibration configuration by a given scaling factor.

7. The apparatus of claim 1, wherein the digital controller is operatively arranged to measure a propagation delay of a calibration signal in the Gm-C filter, and to generate a digital tuning value depending from the measured delay.

8. The apparatus of claim 1, wherein an oscillation amplitude is maintained in a linear operating range of the Gm-C filter.

9. The apparatus of claim 1, wherein the digital to analogue converter comprises proportional to absolute temperature, PTAT, weighted current sources.

10. The apparatus of claim 1, comprising a register, operatively arranged to store the digital tuning value in the filtering configuration.

11. The apparatus of claim 1, wherein the digital controller is operatively arranged to enter a power-off mode or a low-power mode when the filter is in the filtering configuration.

12. The apparatus of claim 1, wherein the apparatus is a RF processor for a global navigation satellite system (GNSS) receiver.

13. Apparatus for tuning a Gm-C filter, comprising:
    means for filtering, including one or several interconnected Gm-C cells, the Gm-C cells having a transconductance amplifier, a tuning terminal, and a transconductance gain (gm) that is dependent from an electric value present on the tuning terminal;
    means for switching the means for filtering between a calibration configuration and a filtering configuration;
    means for measuring a response of the means for filtering in the calibration configuration;
    means for generating a digital tuning value depending on the response measured;
    means for converting said digital tuning value into an analogue tuning signal, fed to the tuning terminals of the Gm-C cells; and
    means for limiting the forward gain when the Gm-C filter is in the calibration configuration;
    wherein the apparatus is operatively arranged to converge, in the calibration configuration, to a predefined response, and the means for converting is operatively arranged to maintain the resulting tuning signal in the filtering configuration.

14. The apparatus of claim 13, wherein the calibration configuration of the means for filtering comprises means for oscillating, and wherein the means for measuring measures a period or a frequency of the oscillations of the means for filtering in the calibration configuration, and generates a digital tuning value depending from the measured period or frequency.

15. The apparatus of claim 14, wherein the means for filtering includes means for amplifying in a local feedback loop, whereby the local feedback has opposite signs in the filtering configuration and in the calibration configuration.

16. The apparatus of claim 15, further comprising means for modifying the transconductance of an output amplifier of the means for filtering, in an amplitude control loop.

17. A method for tuning a Gm-C filter, comprising:
    obtaining a Gm-C filter including one or several interconnected Gm-C cells, the Gm-C cells having a transconductance amplifier, a tuning terminal, and a transconductance gain (gm) that is dependent from an electric value present on the tuning terminal;
    switching the Gm-C filter between a calibration configuration and a filtering configuration;
    measuring a response of the means for filtering in the calibration configuration;
    generating a digital tuning value depending on the response measured;
    converting said digital tuning value into an analogue tuning signal, fed to the tuning terminals of the Gm-C cells; and
    limiting the forward gain when the Gm-C filter is in the calibration configuration;
    wherein the Gm-C filter is operatively arranged to converge, in the calibration configuration, to a predefined response, and the converting step is operatively arranged to maintain the resulting tuning signal in the filtering configuration.

\* \* \* \* \*